(12) United States Patent
Frantz

(10) Patent No.: US 6,972,652 B2
(45) Date of Patent: Dec. 6, 2005

(54) METHOD FOR HOMOGENIZING A SUPER-CONDUCTING NMR MAGNET

(75) Inventor: Wolfgang Frantz, Karlsruhe (DE)

(73) Assignee: Bruker BioSpin GmbH, Rheinstetten (DE)

(*) Notice: Subject to any disclaimer, the term of this patent is extended or adjusted under 35 U.S.C. 154(b) by 22 days.

(21) Appl. No.: 10/884,338

(22) Filed: Jul. 6, 2004

(65) Prior Publication Data

US 2005/0007229 A1 Jan. 13, 2005

(30) Foreign Application Priority Data

Jul. 12, 2003 (DE) .......................................... 103 31 610

(51) Int. Cl.$^7$ ................................................. G01V 3/00
(52) U.S. Cl. ...................... 335/216; 335/299; 324/319; 324/320
(58) Field of Search ................................ 335/216, 299; 324/318–320

(56) References Cited

U.S. PATENT DOCUMENTS

| | | | |
|---|---|---|---|
| 4,816,962 A | | 3/1989 | Yamada et al. |
| 6,265,960 B1 | * | 7/2001 | Schauwecker et al. ...... 335/301 |
| 6,307,370 B1 | * | 10/2001 | Schauwecker et al. ...... 324/318 |
| 6,369,464 B1 | * | 4/2002 | Schauwecker et al. ...... 307/91 |
| 6,563,316 B2 | * | 5/2003 | Schauwecker et al. ...... 324/318 |

FOREIGN PATENT DOCUMENTS

| | | |
|---|---|---|
| GB | 2 070 254 | 9/1981 |
| GB | 2 386 193 | 9/2003 |
| JP | 0 108 1207 | 3/1989 |
| JP | 2000068118 | 3/2000 |
| JP | 2003068519 | 7/2003 |

OTHER PUBLICATIONS

T. Matsuda "Proceedings of the 9$^{th}$ International Conference on Magnet Technology", Zürich, Sep. 9–13, 1985, pp. 246–248.
D. Laukien and W. Tschopp, "Concepts in Magnetic Resonance", 1993, vol. 6, 255–273.

* cited by examiner

Primary Examiner—Ramon M. Barrera
(74) Attorney, Agent, or Firm—Paul Vincent

(57) ABSTRACT

The invention concerns a method for charging a magnet arrangement (20) comprising a first partial region (21) which can be superconductingly short-circuited via an additional switch (23), and a second partial region (22), wherein the two partial regions (21, 22) generate, in an investigational volume (8), gradients of second order having different signs. A magnetic field dependence B* is measured close to the desired operating state of the magnet arrangement (20) and operating currents are determined for each of the two partial regions (21, 22) at which the overall magnetic field B in the volume (8) under investigation is freed from a magnetic field gradient of second order. These operating currents are set thereby taking into consideration the inductive coupling of the partial regions (21, 22) through initially charging of the overall magnet arrangement (20) and, after closing of the additional switch (23), through continuation of charging only in the second partial region (22). The magnetic field homogeneity of the magnet arrangement (20) can thereby be improved in a simple and inexpensive manner.

23 Claims, 4 Drawing Sheets

US 6,972,652 B2

METHOD FOR HOMOGENIZING A SUPER-CONDUCTING NMR MAGNET

This application claims Paris Convention priority of DE 103 31 610.8 filed Jul. 12, 2003 the complete disclosure of which is hereby incorporated by reference.

BACKGROUND OF THE INVENTION

The invention concerns a method for charging a magnet coil arrangement, which is superconductingly short-circuited during operation via a super-conducting main switch to generate a homogenous, temporally stable magnetic field B, which extends in a z-direction, in an investigational volume.

A conference contribution by T. Matsuda et al., Proceedings of the $9^{th}$ International Conference on Magnet Technology, Zürich, Sep. 9–13, 1985, pages 246–248 describes e.g. an eight-part magnet coil arrangement and associated charging method.

NMR (nuclear magnetic resonance) spectroscopy is an important structural analysis method in molecular and solid state physics and in chemistry. NMR is used, in particular, to determine nuclear positions within biological macromolecules (proteins, hormones, enzymes, etc.). Nuclei at different positions in a compound have different resonance frequencies in the NMR spectrum due to the different local chemical surroundings. The shift of the resonance frequency compared to an element-specific standard value, which is characteristic for the chemical surroundings, is referred to as the chemical shift. The measured chemical shift can give information about the structure of the compound.

In large biological molecules, the chemical surroundings at the individual nuclear positions may differ only slightly, which can produce resonance line overlapping of various nuclear positions and impair the structural analysis.

The use of high magnetic field strengths can improve the distinguishability of the resonance lines. The chemical shift of resonance lines is e.g. proportional to the magnetic field strength.

Another important factor which influences the distinguishability of neighboring resonance lines is the line width of the individual resonance lines. Inhomogeneities in the magnetic field increase the line width in the NMR spectrum, since nuclei at identical nuclear positions in spatially distributed molecules are exposed to different magnetic field strengths. The different local magnetic fields produce different resonance frequencies, i.e. which are distributed in accordance with the inhomogeneity. For this reason, one tries to keep magnetic field in homogeneities in NMR magnets as small as possible.

Towards this end, a coil design of the superconducting main magnet is initially used which produces a maximum basic homogeneity. The design of the main magnet usually comprises notch structures, i.e. coil regions without superconducting windings. A typical basic homogeneity represents a magnetic field deviation of 10 ppm within the sample volume. The basic homogeneity is limited e.g. by production tolerances in magnet construction, i.e. in the production of superconducting wires whose dimensions are subjected to manufacture-related variations.

Cryoshim coils are used to improve the homogeneity of the magnetic field and can compensate for field errors up to a certain order. Superconducting, short-circuited coils are typically used to compensate gradients in Z, $Z^2$, X, Y, X*Y, $X^2–Y^2$, Z*Y, Z*X. The longitudinal axis of the coil cylinder of the main magnet thereby defines the z-direction. Cryoshim coils can be charged independently of the main magnet and can increase the field homogeneity in the sample volume to 0.1 ppm.

A further increase in the field homogeneity of up to approximately 0.001 ppm can be achieved with additional room temperature shim systems which consist of resistive copper coils. Room temperature shim systems are located in the room temperature bore of the NMR magnet close to the NMR sample and provide particularly effective compensation for field errors of higher order.

The use of cryoshim coils entails considerable constructive and financial effort in the production of NMR magnets. In case of very large production tolerances in the main magnet, magnetic field gradients of second order of z ($B_2$ gradients) can also occur which cannot be compensated for using cryo and room temperature shim systems, since the cryoshim system has a maximum admissible current. If this maximum current is exceeded, the cryoshim drifts, i.e. the correction field generated thereby is no longer temporally stable. Such high production tolerances require demanding correction measures, such as e.g. exchange of a magnet section.

The conference contribution by T. Matsuda et al., cit.loc. describes a superconducting magnet arrangement having eight coaxial partial coils. Each partial coil has a separate supply unit and superconducting short-circuit switch for direct adjustment of the local current flowing through the respective partial coil. Magnetic field gradients of up to $7^{th}$ order in z should be suppressed through suitable selection of the local currents.

JP 01-081 207 A discloses a device for producing a rapid magnetic field change while avoiding an unstable transitional state with which a first and a second magnetic field coil are superconducting short-circuited via a superconducting main switch. The first magnetic field coil can be additionally separately superconductively short-circuited via an additional superconducting switch.

In contrast thereto, it is the underlying purpose of the present invention to substantially reduce the magnetic field gradients of the main magnet, in particular, the magnetic field gradient of second order in z so that use of a corresponding cryoshim can be omitted, thereby facilitating and reducing the cost of NMR magnet construction.

SUMMARY OF THE INVENTION

This object is achieved by a method for charging a magnet arrangement which is superconductingly short-circuited during operation via a superconducting main switch, and which generates, in an investigational volume, a homogeneous magnetic field B which extends in a z-direction and is temporally stable, wherein the magnet arrangement comprises at least one first and one second partial region, with at least the first partial region being separately superconductingly short-circuited via an additional superconducting switch, and wherein, during operation, the two partial regions generate magnetic fields in the investigational volume, whose expansion coefficients $B_2^{(1)}$ and $B_2^{(2)}$ of second order in z have opposite signs, the method comprising the steps of:

(a) using a supply unit to charge the magnet arrangement, with open main switch and open additional switch, to a first current strength value $I_1$;

(b) Measuring the magnetic field dependence B* in the investigational volume along the z-axis of the magnet arrangement;

(c) Calculating the expansion coefficient $B^*_2 = d^2B^*/dz^2$ of the magnetic field dependence $B^*$ measured in step (b);

(d) Determining additional currents $\Delta I^{(1)}$ and $\Delta I^{(2)}$ through the two partial regions, the additional currents $\Delta I^{(1)}$ and $\Delta I^{(2)}$ being selected to produce an additional magnetic field dependence in the investigational volume having an expansion coefficient of $-B^*_2$;

(e) Calculating a second current strength value $I_2$ throughout the entire magnet arrangement at which the additional switch shall be closed, and a third current strength value $I_3$ of the second partial region which cannot be short-circuited with the additional switch, at which the main switch shall be closed such that, taking into consideration the mutual inductance between the two partial regions after reaching $I_3$ in the second partial region, a current distribution in both partial regions is given in accordance with $$I^{(1)} = I_2 + \Delta I^{(1)} \text{ und } I^{(2)} = I_3 + \Delta I^{(2)}$$

and such that the desired magnetic field B is present in the investigational volume;

(f) Continuing charging of the magnet arrangement through closing of the additional switch when $I_2$ has been reached and closing the main switch when $I_3$ has been reached, wherein $I_2$ is reached before $I_3$.

The invention is based on the central idea of subdividing the main magnet, i.e. the main coil of the magnet arrangement, into at least one first and one second partial region. If the same current flows through all partial regions, the main magnet has an undesired magnetic field gradient in the investigational volume e.g. due to production tolerances. This magnetic field gradient is initially determined through experiments (for subsequent charging of the same magnet arrangement it is not necessary to remeasure the magnetic field dependence of the non-compensated magnet arrangement). The two partial regions influence this magnetic field gradient in opposite manners i.e. with different signs. At the end of the charging process, a considerable current difference of an amount of $\Delta I^{(2)} - \Delta I^{(1)}$ is set between the two partial regions using the inventive method, to reduce the magnetic field gradient in the investigational volume and improve the basic homogeneity of the magnetic field B, thereby obviating corresponding cryoshimming. The inventive method requires only one single supply unit for charging the entire magnet arrangement, which reduces the costs of the magnet arrangement.

One variant of the inventive method is preferred, wherein the main switch is closed during step (b) thereby keeping the current flux in the magnet arrangement highly stable during measurement of the magnetic field dependence $B^*$.

In another preferred variant of the inventive method, the connection between the supply unit and magnet arrangement is separated after step (f) which reduces the load on the supply unit and the operating costs of the magnet arrangement.

In one particularly preferred method variant, the magnet arrangement comprises a supplementary switch for separately, superconductingly short-circuiting the second partial region which cannot be short-circuited by the additional switch. Handling of the magnet arrangement thereby becomes more flexible during the charging process, e.g. through free selection of the partial region to be short-circuited first.

In one design of this method variant, the supplementary switch is advantageously closed after step (f) thereby reducing the heat input to the helium (He) bath and therefore the helium consumption, since keeping a switch open is usually associated with a heat input caused by a heater.

One method variant is also preferred, wherein $|I_1 - I_2| \leq 0.05 |I_2|$. The measurement of the magnetic field dependence $B^*$ thereby occurs in a current strength region and therefore in a magnetic field strength region which is close to the final operating state, i.e. resulting in high accuracy. External disturbances (e.g. through neighboring ferromagnetic installations which influence the magnetic field in the investigational volume) have approximately the same strength during this measurement as during operation.

One method variant is also preferred, wherein $|I_2 - I_3| \leq 0.05 |I_2|$. The current difference between the partial regions is thereby small compared to the absolute current in one of the partial regions. This helps to prevent overload of a superconducting wire in one of the partial regions.

In one particularly preferred inventive method variant, the magnet arrangement is subdivided into two partial regions such that an optimum gradient lift $b_2$ is produced in both partial regions, in particular, a maximum gradient lift $b_2$, wherein the gradient lift $b_2$ characterizes the change in the expansion coefficient of the magnetic field B of second order of z per current strength change $\Delta I$ in accordance with $b_2 = \Delta B_2/\Delta I = \Delta(d^2B/dz^2)/\Delta I$. The magnet arrangement may e.g. be subdivided into two partial regions such that the sum of the magnitude of the gradient lifts $|b_2^{(1)}| + |b_2^{(2)}|$ is maximum. A subdivision which can be universally used provides that $b_2^{(1)} \approx -b_2^{(2)}$ (without production tolerances $b_2^{(1)} = -b_2^{(2)}$). If the magnitude of the gradient lift $b_2$ in the two partial regions is relatively large, in particular, through selection of the first partial region as homogenization part of the main field coil, compensation of the magnetic field gradient is already possible using relatively small additional currents, and charging may be performed at a particularly high speed to prevent possible current overload of the superconductor. If only one supply unit with little current strength adjustment accuracy is available, the magnetic field gradient compensation accuracy can be improved through selection of partial regions having a low absolute gradient lift value.

In a preferred method variant, the additional currents $\Delta I^{(1)}$ and $\Delta I^{(2)}$ in the two partial regions differ by at least a factor of 5 when $I_3$ has been reached. In this case, the partial region with the additional current having the higher magnitude substantially provides the compensation. This partial region is preferably provided with a low magnetic field lift of zero order $b_0$.

One design of this variant of the inventive method is preferred with which the first partial region which can be short-circuited via the additional switch has the additional current of lower magnitude when $I_3$ has been reached. This means that $|\Delta I^{(1)}| < |\Delta I^{(2)}|$. In this case, the supply unit current can be set with greater accuracy.

One design of this variant of the inventive method alternatively provides that the second partial region has the additional current of lower magnitude after $I_3$ has been reached. This means that $|\Delta I^{(1)}| > |\Delta I^{(2)}|$. The second part is generally the field part of the coil such that current overload of highly loaded superconductors can be prevented.

In a further preferred method variant, the coupling degree K of the partial regions is smaller than 0.9, preferably smaller than 0.5. Coupling degree thereby means the quotient of the magnetic field changes in the investigational volume in the two partial regions which is caused by a (mains) current change in one partial region (e.g. the second partial region), i.e. $K = |\Delta B^{(1)}|/|\Delta B^{(2)}|$. With a coupling degree of 1, the overall magnetic field B could not be changed through a current change in one of the partial regions. With a coupling degree of zero, the partial regions would be completely decoupled. With the low coupling degree in accordance with the invention, the magnetic field in the investigational volume can be adjusted with small current changes.

One design of this method variant is particularly preferred, with which the two partial regions are inductively decoupled. This greatly facilitates compensation of the magnetic field gradients. Differential equations, describing the coupling and used for determining the additional currents, must not be solved.

In one additional advantageous method variant, the magnet arrangement is actively shielded.

In one advantageous method variant, $I_2<I_3$ when the additional switch is closed during operation. In this case, positive $B_2$ gradients can be compensated for in a short-circuited homogenizing partial region of the magnet (with positive gradient lift $b_2$).

In one advantageous method variant, $I_2>I_3$ when the additional switch is closed during operation. In this case, a negative $B_2$ gradient is compensated for in the homogenizing partial region of the magnet (with positive gradient lift $b_2$) through discharging to $I_3$ after $I_2$ has been reached and the additional switch has been closed.

In one particularly preferred variant of the inventive method, the magnet arrangement has, in addition to the first and second partial regions, at least one further third partial region which can be separately superconductingly short-circuited through a further additional switch. The third partial region renders the magnet arrangement more flexible. The additional partial region may e.g. be used to increase the accuracy of compensation of the magnetic field gradients or for compensation of an additional higher order of magnetic field gradients (in particular fourth order).

In one advantageous embodiment of this method variant, the method steps (a) through (f) are repeated in step (f) between closing of the additional switch and closing of the main switch wherein during the repetition, the third partial region and the additional switch with which the third partial region can be superconductingly short-circuited assume the role of the first partial region and of the additional switch with which the first partial region can be superconductingly short-circuited. In particular, after adjustment of the current strength in the first partial region, the magnetic field dependence in the investigational volume is newly measured. The second and third partial regions can be charged in accordance with the invention analogously to charging of a first and second partial region of a simple magnet arrangement with two regions as described above. The individual partial regions preferably have a negligible magnetic field lift of zero order, second order (gradient lift of second order) or fourth order (gradient lift of fourth order)in z. This facilitates the compensation method through breaking up of the compensation parameters, namely the respective additional currents in the partial regions.

In another variant of the above-mentioned method variant, the first partial region causes rough compensation and the third partial region causes fine compensation of the magnetic field gradient $B_2$ of second order in z. The magnetic field dependence is typically measured between closing of the respective additional switch. Subdivision of compensation into rough and fine adjustment improves the overall accuracy of magnetic field homogenization which can be obtained.

Further advantages of the invention can be extracted from the description and the drawing. The features mentioned above and below may be used in accordance with the invention either individually or collectively in arbitrary combination. The embodiments shown and described are not to be understood as exhaustive enumeration but have exemplary character for describing the invention.

The invention is shown in the drawing and is explained in more detail with reference to embodiments.

DESCRIPTION OF THE PREFERRED EMBODIMENT

Magnet arrangements, i.e. solenoidal coils, generate a magnetic field B in a central region (the investigational volume). The cylinder axis of the solenoid thereby passes through the investigational volume and forms the z-axis of an orthogonal coordinate system.

The magnetic field B can be expanded about the center of the investigational volume in the z-direction in accordance with:

$$B(z)=B_0+B_1z+B_2z^2+B_3z^3+B_4z^4+\ldots$$

wherein, with solenoidal symmetry, the $B_i$-contributions with odd index i vanish (on which the following is based). The $B_i$-contributions of higher order (than zero) are also called magnetic field gradients of i-th order.

The magnetic field strength B is thereby directly proportional to the current strength I in the generating coil. The contribution to the magnetic field B per current strength I is thereby called the lift b. The following therefore applies for the magnetic field B in the vicinity of the coordinate origin:

$$B(z, I)=b\ I=(b_0+b_2z^2+b_4z^4+\ldots)*I.$$

The lift b of a magnet arrangement is thereby composed of a lift $b_0$ of zero order and lifts of higher order ($b_2$, $b_4$, etc.), the so-called gradient lifts. If the magnet arrangement has noticeable gradient lifts, the field generated by the magnet arrangement is inhomogeneous (i.e. variable with z) which widens the resonance lines in NMR measurements, providing inaccurate measurements.

The gradient lift of second order $b_2$ is of particular importance. It is generally that contribution to a magnetic field homogeneity of a magnet arrangement, i.e. a superconducting solenoidal main field coil, which requires the most compensating effort.

To keep the magnetic field inhomogeneity of a magnet arrangement small, one tries to keep the gradient lifts small through suitable coil design. So-called notch structures are commonly used. Notch structures are coil regions without (superconducting) winding, see also "superconducting NMR magnet design", D. Laukien, W. Tschopp in Concepts in Magnetic Resonance, 1993, 6, 255–273.

Figure 1:
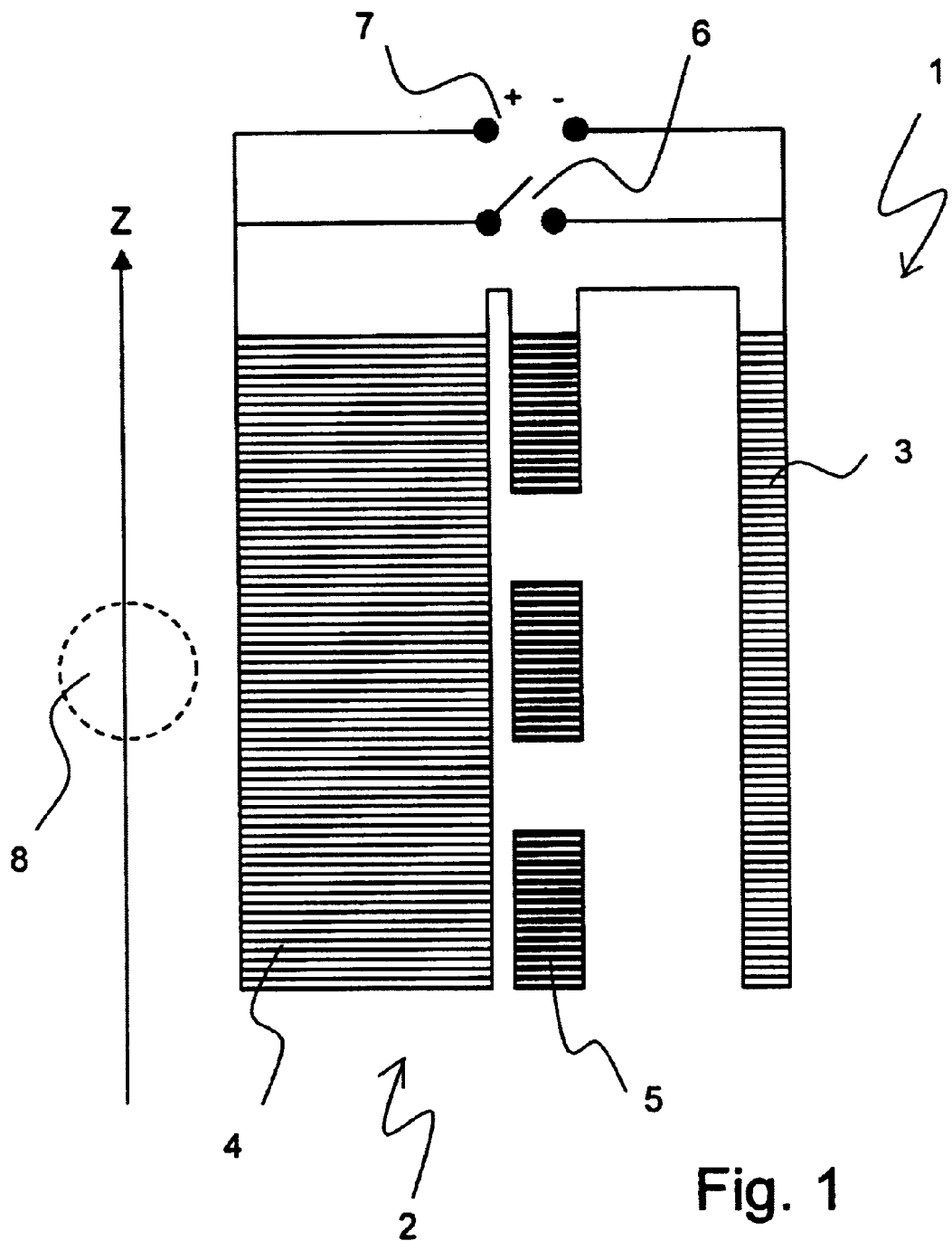
FIG. 1 shows a conventional magnet arrangement with field part, homogenization part and shielding coil.

FIG. 1 shows a cross-section of half of a magnet arrangement 1 as used in prior art NMR spectroscopy. The magnet arrangement 1 consists substantially of a main field coil 2 and a shielding coil 3. The main field coil 2 comprises a field part 4 which consists of a continuous uniformly wound coil body, and a homogenization part 5. The homogenization part 5 has gaps in its winding along the z-direction, so-called notches (wherein full notch or also half notch structures are possible). The homogenization part 5 may also comprise several locally separated coil regions. The field part 4, the homogenization part 5 and the shielding coil 3 are conventionally connected in series and can be short-circuited with a common superconducting main switch 6. Field part 4, homogenization part 5 and shielding coil 3 are charged with a uniform current via a common supply unit 7.

The field part 4 substantially generates the desired magnetic field B (in particular its $B_0$ contribution) in the investigational volume 8. However, the field part 4 generally also produces negative magnetic field gradients $B_2^{(field\ portion)} < 0$, $B_4^{(field\ portion)} < 0$, $B_6^{(field\ portion)} < 0$ etc. To homogenize the entire magnetic field B in the investigational volume 8, the homogenization part 5 is designed to generate diametrically opposed positive magnetic field gradients. The aim of the coil design is, in particular, to achieve $$B_2^{(field\ portion)} = -B_2^{(homogeniation\ portion)}.$$

If the shielding coil 3, which is wound in the opposite direction to the field part 4, is supposed to considerably contribute to the magnetic field gradient, it must of course also be taken into consideration. The contribution of the shielding coil 13 may then be added to the field part 4 for reasons of simplicity. For this reason, the shielding coil 3 will not be explicitly described below.

Production tolerances (i.e. dimensional variations of the superconducting wire) in the field part 4 and in the homogenization part 5 are the conventional problems of the magnet arrangement 1 and operation thereof. They produce a considerable overall gradient of second order, i.e. $B_2 = B_2^{(field\ portion)} + B_2^{(homogenization\ portion)} \neq 0$, and due to the identical current, the following also applies for the gradient lifts $|b_2^{(field\ portion)}| - |b_2^{(homogenization\ portion)}| \neq 0$. These residual gradients must be conventionally compensated for through cryoshim coils and/or room temperature shim coils.

Figure 2:
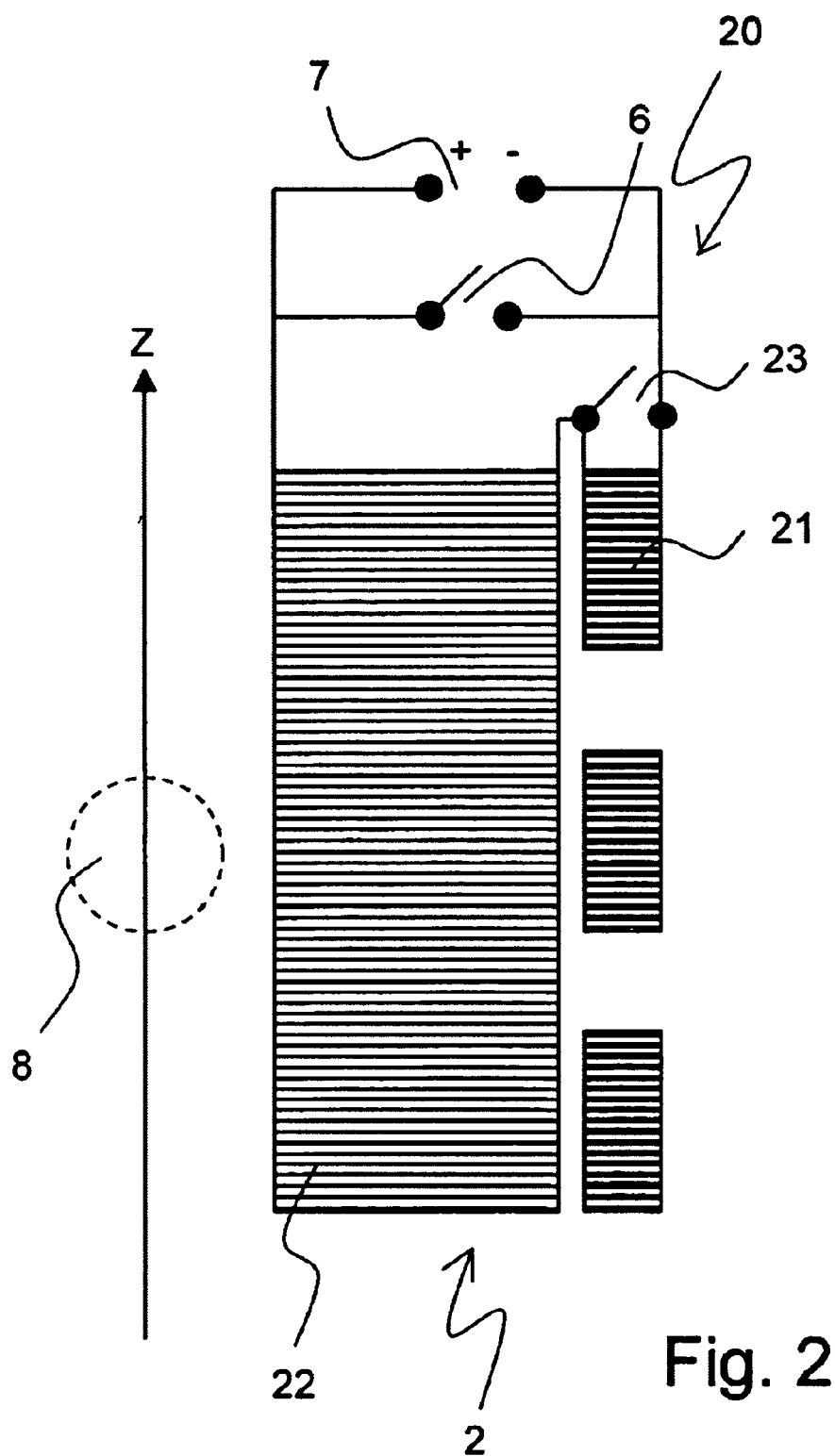
FIG. 2 shows a magnet arrangement comprising a first and a second partial region with additional switch and main switch for carrying out the inventive method.

The inventive teaching provides different ways of compensation. FIG. 2 shows a suitable arrangement for carrying out the inventive method.

A magnet arrangement 20 substantially comprises a main field coil 2. It comprises a first partial region 21 which comprises the homogenization part of the magnet arrangement 20 and a second partial region 22, which comprises the field part of the main coil 2. (This is a possible subdivision of the main field coil 2. Other subdivisions of a main field coil into partial regions are basically also possible in accordance with the invention; e.g. a first partial region may comprise homogenization and field portions). The first partial region 21 and the second partial region 22 are connected in series and can be charged via a supply unit 7. The overall magnet arrangement 20 can be superconductingly short-circuited via a main switch 6. The first partial region 21 can be additionally separately superconductingly short-circuited via an additional switch 23.

It is the basic idea of the inventive method to charge the first and the second partial regions 21, 22 with different current strengths $I^{(1)}$, $I^{(2)}$ which is fundamentally rendered possible by the additional switch 23. The different current fluxes in the two partial regions 21, 22 may generate a negligible gradient $B_2$ of second order of the overall arrangement, wherein the following must apply:

$$I^{(1)}/I^{(2)} = -b_2^{(2)}/b_2^{(1)},$$

with the exponents indicating the partial region.

The different currents are basically adjusted through charging of the overall magnet arrangement 20, and therefore also of the first partial region 21, to a current $I_2$, short-circuiting the first partial region 21 with the additional switch 23, and continuation of the charging process to a current $I_3$ in the remaining second partial region 22. The charging process may also be continued by reducing the current flux (discharge).

Due to the coupling effects which are usually present, the coupling behavior of the two partial regions must be taken into consideration for determining the charging currents: If the first partial region 21 is short-circuited and the current in the second partial region 22 is increased, a counter current is generally induced in the first partial region i.e. the current in the short-circuited first partial region is changed. This coupling can be calculated. Generally, a final resulting magnetic field B should be obtained.

The charging method is carried out as described in detail below:

1. The magnet arrangement 20 is supplied with a current $I_1$. The magnetic field $B_0^*(I_1)$ generated at this current strength is approximately as large as the desired magnetic field B, with a preferably relative deviation of less than 10%. The main switch 6 and additional switch 23 are thereby open.

2. When $I_1$ has been reached, the magnet arrangement is parked, i.e. the main switch 6 is closed and the supply unit 7 is switched off. The magnetic field dependence B* in the investigational volume is now measured along the z-axis to determine the magnetic field gradient $B_2^*$ of second order. The star indicates the result of this measurement at $I_1$. The measurement may be carried out e.g. through guiding an NMR sample or a Hall probe on a rod assembly along the z-axis, i.e. along the axis of rotation of the main solenoidal coil.

3. The further method parameters are determined on the basis of the measured magnetic field gradient $B_2^*$ and of a final gradient derived therefrom (if B is reached without compensation: the description of the calculation method described below assumes that the measured magnetic field gradient is sufficiently close to the final gradient that no differentiation is necessary). Charging is generally effected with a linearly rising current strength for the supply unit 7 such that points in time must now be determined at which the additional switch 23 and main switch 6 must be closed to adjust certain current strengths in the partial regions 21, 22. Closing of the additional switch 23 fixes the current in the first partial region at $I_2$ with the exception of induction influences. The point in time must be calculated from which charging of the magnet arrangement with the short-circuited first partial region 21 must be continued (or discharged after exceeding a target current) such that when the target current has been reached in the first partial region 21 (homogenization part) a magnetic field gradient is obtained which compensates that of the second partial region 22 (field part). Moreover, the respective currents in the partial regions 21, 22 must lead to the predetermined target magnetic field B. Two cases may occur:

Case 1: The measured $B_2^*$-gradient of the overall system is positive. If the first partial region 21 (homogenization part) is short-circuited at the right time, and the magnet arrangement 20 is further charged, a negative additional current is induced into the short-circuited first partial region 21, reducing its positive $B_2$ gradient such that when the final field B has been reached, the overall $B_2$ gradient is eliminated in connection with direct influence of the second partial region 22 on the $B_2$-gradient.

Case 2: the measured $B_2^*$-gradient is negative. In this case, the target field B must be surpassed and the first partial region 21 must be short-circuited. If the remaining magnet arrangement 20 is now discharged, a positive additional current is induced in the short-circuited first partial region 21 which increases the $B_2$ gradient in this partial region such that when the final field B has been reached, the overall $B_2$ gradient is eliminated in connection with the direct influence of the second partial region 22 on the $B_2$-gradient.

Figure 3:
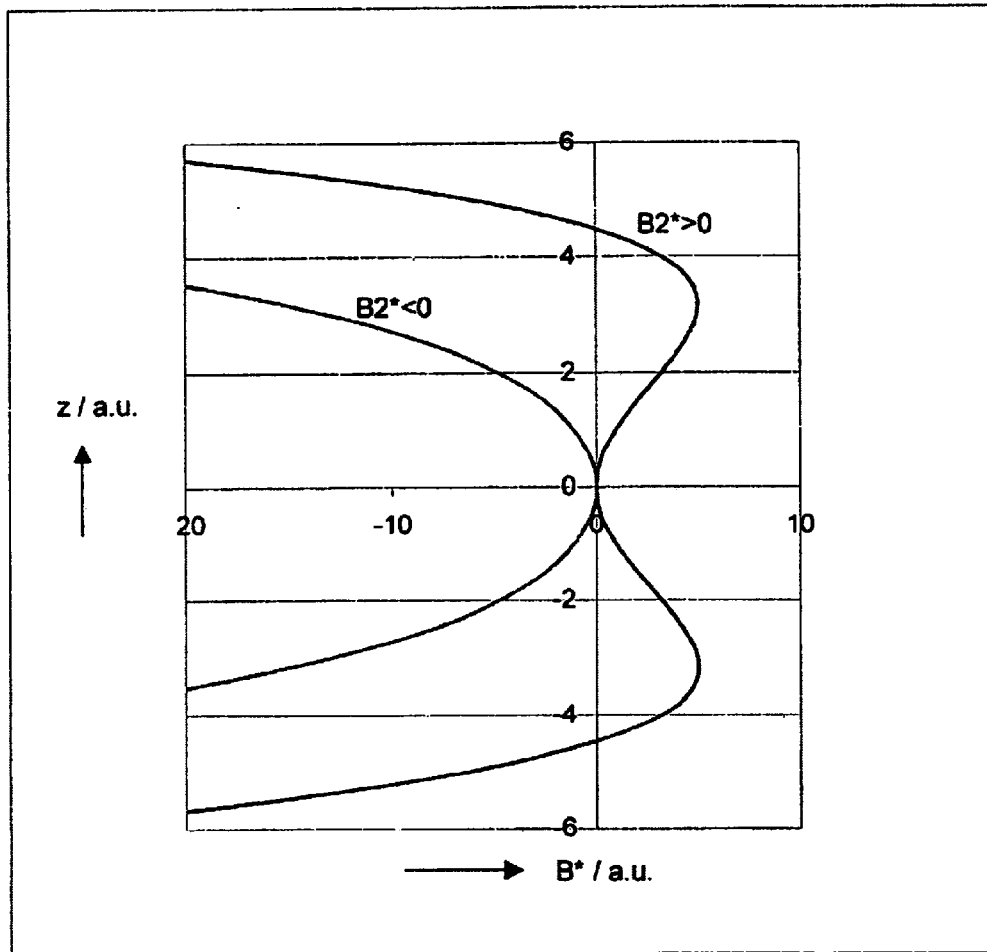
FIG. 3 shows a B*–z-diagram of two magnet arrangements with $B_2^*>0$ and $B_2^*<0$.

FIG. 3 shows a B* dependence for each of both above cases, as a function of the spatial parameter z. In the first case (right-hand curve) the B* field rises in the vicinity of z=0, locally parabolic, i.e. $B_2^*>0$. However, in the second case (left-hand curve) the B* field drops like a parabola in the vicinity of z=0, i.e. $B_2^*<0$.

In both cases, the lifts of zero and second order of the two partial regions $b_0^{(1)}$, $b_2^{(1)}$, $b_0^{(2)}$, $b_2^{(2)}$ and the inherent and mutual inductances of the two partial regions must be included in the calculation of $I_2$ and $I_3$. This information can be calculated from the coil geometries.

4. When the final field has been reached—which is the case when $I_3$ has been obtained in the second partial region—the main switch 6 over the entire magnet arrangement (i.e. the first and second partial regions) is closed. At this time, different currents flow through the first and second partial regions, i.e. $I^{(1)}=I_2+\Delta I^{(1)}$ and $I^{(2)}=I_2+\Delta I^{(2)}$, wherein $I_2$ is the current at which the additional switch was closed. The contribution of $I_2$ is thereby substantially dependent on the desired target field B in the investigational volume 8, and the additional currents $\Delta I^{(1)}$ and $\Delta I^{(2)}$ are substantially a function of the gradient lift $b_2$ of second order of the magnet arrangement 20. The additional current $\Delta I^{(1)}$ is thereby generated exclusively through inductive coupling with the second partial region 22, and the additional current $\Delta I^{(2)}$ can be controlled directly via the supply unit 7.

A calculation method for determining the charging parameters of an inventive charging method is described below.

The magnet coil arrangement is divided into two partial regions, wherein the first partial region is superconductingly short-circuited with an additional switch when a current $I_2$ has been reached. The magnet arrangement is subsequently further charged with a current $U_o$ for a time period of $\Delta t$. The values $I_2$ and $\Delta t$ must now be determined such that when the main switch is closed (i.e. when $\Delta t$ has elapsed) the desired field B (or the desired current $I_3$) is reached and the measured (or calculated) gradient of second order ($B_2^*$) is eliminated.

Terms:

$U_o$=charging voltage after short-circuiting the first partial region.

$L^{(1,2)}$=inherent inductances of the partial regions 1 and 2.

M=coupling inductance between the two partial regions.

$b_2^{(1,2)}=B_2$ gradient lifts ($B_2$ gradient per ampere) of the partial regions 1 and 2.

$b_0^{(1,2)}=B_o$ field lifts ($B_o$ field per ampere) of the two partial regions 1 and 2.

$b_0=B_o$ field lift for the entire magnet arrangement without additional short-circuit.

$\Delta B_2=B_2$ additional gradient due to the additional currents $\Delta I^{(1)}$, $\Delta I^{(2)}$.

$B_2^*=B_2$ gradient evaluated in step (c)

$\Delta B_o=B_o$ additional field due to additional currents $\Delta I^{(1)}$, $\Delta I^{(2)}$.

The time dependence of the two partial currents $I^{(1)}$, $I^{(2)}$ in the two partial regions after closing the additional switch are given by the coupled differential equations:

$$L^{(1)}*dI^{(1)}/dt+M*dI^{(2)}/dt=0$$

$$M*dI^{(1)}/dt+L^{(2)}*dI^{(2)}/dt=U_o.$$

After a time interval $\Delta t$ after the additional switch has been closed, the following additional currents are obtained:

$$\Delta I^{(1)}_{(\Delta t)}=-U_o*\Delta t*M/(L^{(1)}*L^{(2)}-M^2)$$

$$\Delta I^{(2)}_{(\Delta t)}=U_o*\Delta t*L^{(1)}/(L^{(1)}*L^{(2)}-M^2).$$

The time dependence of the additional gradient of second order, caused by the additional currents, of the entire magnet arrangement is:

$$\Delta B_{2(\Delta t)}=b_2^{(1)}*\Delta I^{(1)}_{(\Delta t)}+b_2^{(2)}*\Delta I^{(2)}_{(\Delta t)}$$

wherein, in case of subdivision into two partial regions (with sufficient accuracy), the following applies:

$$b_2^{(1)}=-b_2^{(2)}$$

which results in:

$$\Delta B_{2(\Delta t)}=b_2^{(1)}*(\Delta I^{(1)}_{(\Delta t)}-\Delta I^{(2)}_{(\Delta t)})$$

or with the above-stated additional currents:

$$\Delta B_{2(\Delta t)}=-\Delta t*b_2^{(1)}*U_o*(M+L^{(1)})/(L^{(1)}*L^{(2)}M^2).$$

The following requirement determines the time interval $\Delta t$ during which the additional switch must remain closed:

$$\Delta B_{2(\Delta t)}=-B_2^*.$$

The additional gradient generated by the additional currents thereby precisely compensates the gradient (or expansion coefficient) of second order calculated in method step (c) on the basis of the measured magnetic field dependence thereby giving:

$$\Delta t=(B_2^*/b_2^{(1)})*(1/U_o)*(L^{(1)}*L^{(2)}-M^2)/(M+L^{(1)}).$$

In addition to the time interval $\Delta t$ which is defined through elimination of the gradient of second order, the point in time must also be fixed at which the additional switch must be closed to ensure that the magnet arrangement has its desired field ($B_0$) after expiration of the interval $\Delta t$ when the main switch is closed.

The magnetic field $B_{o,I2}$ (or the magnetic current $I_2$), at which the additional switch must be closed, is therefore defined by the following requirement:

$$B_{o,I2}=B_o-\Delta B_{o,(\Delta t)}=B_o-(b_o^{(1)}*\Delta I^{(1)}_{(\Delta t)}+b_o^{(2)}\Delta I^{(2)}_{(\Delta t)}).$$

The use of the solutions for the additional currents and $\Delta t$ derived from the homogeneity requirements produces:

$$B_{o,I2}=B_o-(B_2^*/b_2^{(1)})*[b_o^{(2)}*L^{(1)}/(M+L^{(1)})-b_o^{(1)}*M/(M+L^{(1)})].$$

Wherein for $I_2$ applies:

$$I_2=B_{o,I2}/b_o.$$

The invention concerns a method for charging a magnet arrangement 20 which comprises a first partial region 21 which can be superconductingly short-circuited by means of an additional switch 23, and a second partial region 22, wherein the two partial regions 21, 22 generate, in an investigational volume 8, gradients of second order having different signs. A magnetic field dependence B* is measured close to the desired operating state of the magnet arrangement 20 and operating currents are determined for each of the two partial regions 21, 22, such that the overall magnetic field B in the investigational volume 8 has no magnetic field gradient of second order. These operating currents are set thereby taking into consideration the inductive coupling of the partial regions 21, 22 through initially charging the entire magnet arrangement 20 and, after closing the additional switch 23, through continuation of the charging process only in the second partial region 22. This improves the homogeneity of the magnetic field of the magnet arrangement 20 in a simple and inexpensive manner.

Figure 4:
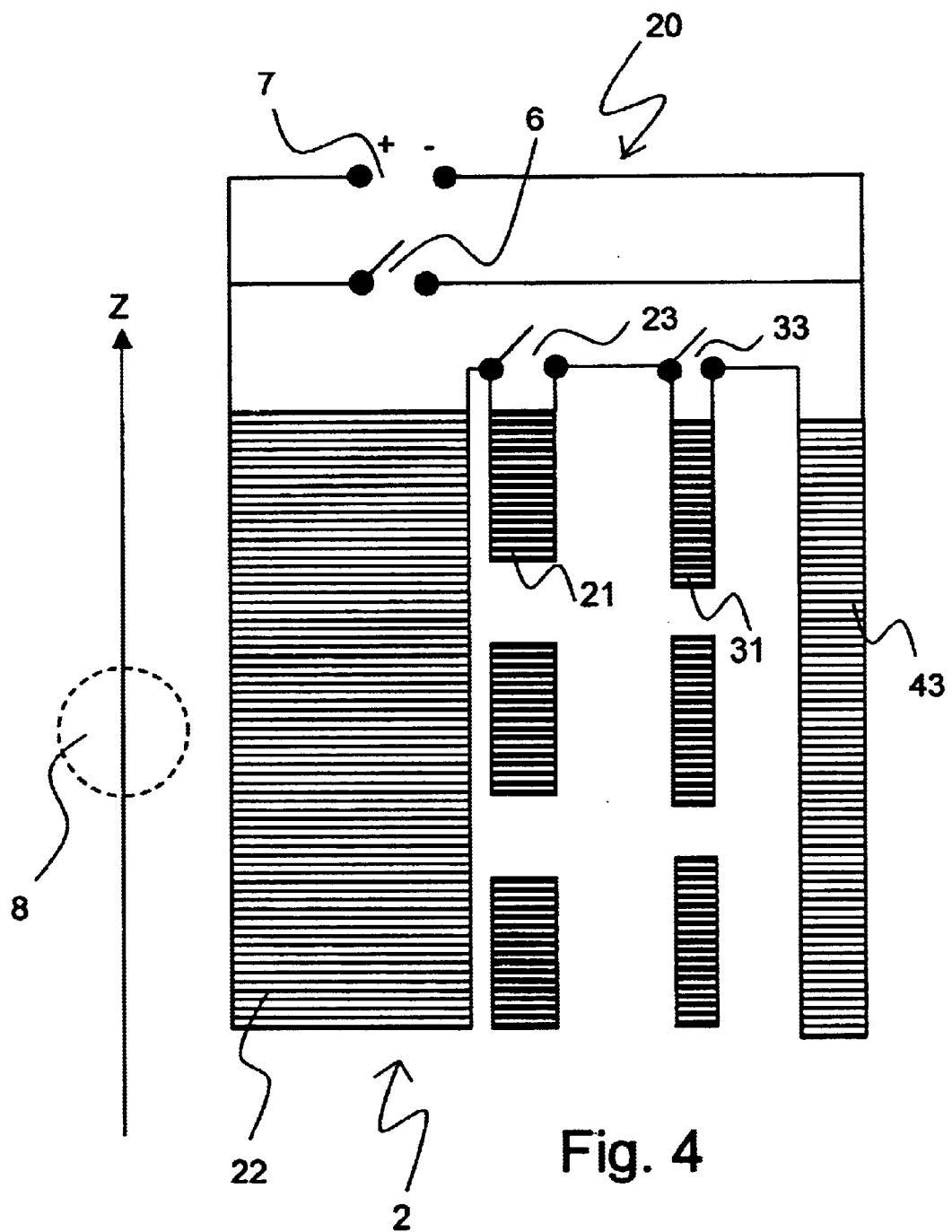
FIG. 4 shows a magnet arrangement comprising a third partial region with a third additional switch and an active shielding.

FIG. 4 shows another preferred embodiment of the invention with which the magnet system has an active shielding 43. The system also comprises a further partial region 31 which can be separately superconductingly short-circuited via a further additional switch 33.

I claim:

1. A method for charging a magnet system which is superconductingly short-circuited during operation via a superconducting main switch, to generate, in an investigational volume, a homogeneous temporally stable magnetic field B which extends in a z-direction, wherein the magnet system comprises at least one first and one second partial region, wherein said first partial region can be separately superconductingly short-circuited via an additional superconducting switch and the second partial region cannot be short circuited by that additional switch, said first and said second partial regions generating magnetic fields in the investigational volume during operation whose expansion coefficients $B_2^{(1)}$ and $B_2^{(2)}$ of second order in z have opposite signs, the method comprising the steps of:

a) charging the magnet system with open main switch and open additional switch using a supply unit to a first current strength value $I_1$;

b) measuring a magnetic field dependence $B^*$ in the investigational volume along the z-axis of the magnet system;

c) calculating an expansion coefficient $B^*_2 = d^2B^*/dz^2$ of said magnetic field dependence $B^*$ measured in step b);

d) determining additional currents $\Delta I^{(1)}$ and $\Delta I^{(2)}$ in said first and said second partial regions, said additional currents $\Delta I^{(1)}$ and $\Delta I^{(2)}$ being selected to produce an additional magnetic field dependence in the investigational volume having an expansion coefficient of $-B^*_2$;

e) calculating a second current strength value $I_2$ throughout the magnet system at which said additional switch shall be closed, and a third current strength value $I_3$ of said second partial region at which said main switch shall be closed such that, taking into consideration mutual inductance between said first and said second partial region, after reaching said third current strength in said second partial region, a current distribution in said first and said second partial regions as given by $$I^{(1)} = I_2 + \Delta I^{(1)} \text{ and } I^{(2)} = I_3 + \Delta I^{(2)}$$

generates a desired magnetic field B; and f) continuing charging the magnet arrangement while closing said additional switch when $I_2$ has been reached and while closing said main switch when $I_3$ has been reached, wherein $I_2$ is obtained prior to $I_3$.

2. The method of claim 1, wherein said main switch is closed during step b).

3. The method of claim 1, wherein, after step f), a connection between said supply unit and the magnet system is separated.

4. The method of claim 1, wherein the magnet system further comprises a supplementary switch for superconductingly short-circuiting said second partial region.

5. The method of claim 4, wherein said supplementary switch is closed after step(f).

6. The method of claim 1, wherein $|I_1-I_2| \leq 0.05|I_2|$.

7. The method of claim 1, wherein $|I_2-I_3| \leq 0.05|I_2|$.

8. The method of claim 1, wherein the magnet system is subdivided into said first and said second partial regions to produce an optimum gradient lift $b_2$ in said first and said second partial regions, wherein said gradient lift $b_2$ defines a change in an expansion coefficient of the magnetic field B of second order in z per current strength change $\Delta I$ in accordance with $b_2 = \Delta B_2/\Delta I = \Delta(d^2B/dz^2)/\Delta I$.

9. The method of claim 8, wherein said gradient lift $b_2$ is a maximum gradient lift $b_2$.

10. The method of claim 1, wherein, when $I_3$ has been reached, said additional currents $\Delta I^{(1)}$ and $\Delta I^{(2)}$ in said first and said second partial regions differ by at least a factor of 5.

11. The method of claim 10, wherein said first partial region has a smaller additional current when $I_3$ has been reached.

12. The method of claim 10, wherein said second partial region has a smaller additional current when $I_3$ has been reached.

13. The method of claim 1, wherein a coupling degree K between said first and said second partial regions is smaller than 0.9.

14. The method of claim 1, wherein a coupling degree K between said first and said second partial regions is smaller than 0.5.

15. The method of claim 13, wherein said first and said second partial regions are inductively decoupled.

16. The method of claim 1, wherein the magnet system is actively shielded.

17. The method of claim 1, wherein $I_2 < I_3$ when said additional switch is closed during operation.

18. The method of claim 1, wherein $I_2 > I_3$ when said additional switch is closed during operation.

19. The method of claim 1, further comprising at least one further third partial region which can be separately superconductingly short-circuited via a further additional switch.

20. The method of claim 19, wherein in step f), between said closing of said additional switch and said closing of the main switch, the method steps a) through f) are repeated, wherein during repetition, said third partial region and said further additional switch with which said third partial region can be superconductingly short-circuited, take a place of said first partial region and of said additional switch with which said first partial region can be superconductingly short-circuited.

21. The method of claim 19, wherein said first partial region causes rough compensation and said third partial region causes fine-compensation of said magnetic field gradient $B_2$ of second order in z.

22. The method of claim 19, wherein said third partial region is used for stray field compensation.

23. The method of claim 22, wherein an additional dipole moment of said first and/or said second partial region, which is generated when said first and/or said second partial region is/are charged, is compensated for by said third partial region.

* * * * *